United States Patent [19]

Yoshida et al.

[11] 4,275,359
[45] Jun. 23, 1981

[54] MOS FET AMPLIFIER

[75] Inventors: Tadao Yoshida; Tadao Suzuki, both of Tokyo, Japan

[73] Assignee: Sony Corporation, Tokyo, Japan

[21] Appl. No.: 26,587

[22] Filed: Apr. 4, 1979

[30] Foreign Application Priority Data

Apr. 11, 1978 [JP] Japan .................................. 53-42420

[51] Int. Cl.³ ............................................. H03F 3/217
[52] U.S. Cl. .................................... 330/251; 330/264; 330/298; 330/300
[58] Field of Search .................. 330/207 A, 251, 264, 330/298, 300, 277; 307/200 A, 251, 253

[56] References Cited

U.S. PATENT DOCUMENTS 3,976,955  8/1976  Hamada ....................... 330/207 A X Primary Examiner—James B. Mullins
Attorney, Agent, or Firm—Hill, Van Santen, Steadman, Chiara & Simpson

[57] ABSTRACT

A MOS-type FET (field effect transistor) amplifier includes a pair of P-channel and N-channel output stage MOS-type FETs which are ON-OFF controlled by a pulse signal and an inductive load. Each reverse current caused by the inductive load is shunted by a diode connected between the drain and source of each of the MOS-type FETs. An additional pair of diodes are provided in the drain-source circuits of the MOS-type FETs so as to prevent each reverse current flowing through respective substrates of the MOS-type FETs.

6 Claims, 8 Drawing Figures

MOS FET AMPLIFIER

BACKGROUND OF THE INVENTION

1. Field of the Invention

The present invention relates to a MOS-type FET amplifier, and more particularly relates to a MOS-type FET amplifier which has an excellent switching speed.

2. Description of the Prior Art

In the art, a class-D amplifier using a field effect transistor has been proposed by the same assignee of the instant application.

For example, the U.S. Pat. No. 4,021,748 entitled in "Amplifier with Field Effect Transistors having Triode type dynamic characteristics" shows such a class-D power amplifier.

However, as such a triode type field effect transistor is normally a depletion type transistor, it would have a rather complicated drive stage. On the other hand, a MOS-type field effect transistor has recently developed for a power amplifier use which has large drain current capability and higher drain breakdown voltage. Such a MOS-type FET is known as an enhancement type transistor, in which it would be possible to simplify a drive circuit as compared to that of the depletion type FET. In general, a MOS-type FET is also required to electrically connect its substrate to the source electrode in order to stabilize the potential thereof. Such a connection would provide a PN junction between drain and source electrodes through a substrate so as to deteriorate the switching speed thereof in the case of class-D amplifying mode.

OBJECTS AND SUMMARY OF THE INVENTION

Accordingly, it is an object of the present invention is to provide an improved amplifier which is free from the drawbacks found in the prior art amplifier.

Another object of the invention is to provide an improved amplifier which is capable of accomodating higher switching speed and is useful for use with a PWM (pulse width modulated) signal amplifier.

In accordance with one example of the present invention, a MOS-type FET amplifier is provided, which includes a DC voltage source having first and second terminals, a first MOS-type FET having gate, source and drain electrodes, a second MOS-type FET having gate, source and drain electrodes, a pulse signal source circuit for supplying a pair of drive signals to the gate electrodes of the first and second FETs with the same phase relation to each other, a first circuit for connecting the source and drain electrode of the first FET between the first terminal of the DC voltage source and an output terminal, a second circuit for connecting the source and drain electrodes of the second FET between the second terminal of the DC voltage source and the output terminal, a third circuit consisting of a first diode having anode and cathode electrodes and for connecting the anode and cathode thereof between the output terminal and the first terminal of the DC voltage source, a fourth circuit consisting of a second diode having anode and cathode electrodes and for connecting the anode and cathode thereof between the second terminal of the DC voltage source and the output terminal, a low pass filter connected to the output terminal so as to flow a forward current and a reverse current to a load in response to the drive signal from the pulse signal source circuit, a fifth circuit consisting of a third diode having anode and cathode electrodes and connecting the anode and cathode thereof between the first terminal of the DC voltage source and the output terminal in series with the source and drain circuit of the first FET so as to prevent the reverse current from flowing through the first FET, and a sixth circuit consisting of a fourth diode having anode and cathode electrodes and connecting the anode and cathode thereof between the second terminal of DC voltage source and the output terminal in series with the drain and source circuit of the second FET so as to prevent the reverse current from flowing through the second FET.

The other objects, features and advantages of the present invention will be apparent from the following descriptions taken in conjunction with the attached drawings through which the like references designate the same elements.

DESCRIPTION OF THE PREFERRED EMBODIMENT

Before describing the present invention, an example of the prior art MOS-type FET amplifier will be firstly described with reference to FIGS. 1 to 4.

Figure 1:
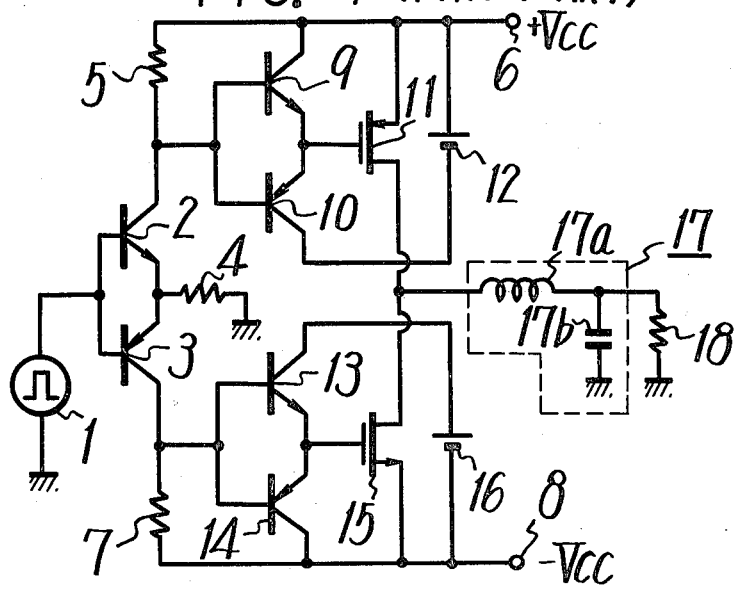
FIG. 1 is a circuit diagram of the prior art MOS-type FET amplifier.

FIG. 1 shows an example of the prior art MOS-type FET amplifier which is used to amplify a PWM (pulse width modulated) signal. In FIG. 1, reference numeral 1 designates a signal source which produce a PWM sound signal having the center frequency of, for example, 500 KH$_z$. The signal source 1 is connected at its one end to the ground and its other end to the connection point between the bases of an NPN-type transistor 2 and a PNP-type transistor 3. The emitters of transistors 2 and 3 are connected together to the ground through a resistor 4. The transistor 2 has the collector connected through a resistor 5 to a power supply terminal 6 which is supplied with a positive DC voltage +Vcc and the transistor 3 has the collector connected through a resistor 7 to a power supply terminal 8 which is supplied with a negative DC voltage −Vcc whose absolute value is equal to that of positive DC voltage +Vcc. The collector of transistor 2 is connected also to the connection point between the bases of an NPN-type transistor 9 and a PNP-type transistor 10 which form a buffer amplifier. The emitters of transistors 9 and 10 are connected together to the gate of a P-channel MOS-type FET 11 which serves as a switching element. The transistor 9 has the collector connected to the positive power supply terminal 6, and the transistor 10 has the collector connected to the negative electrode of a battery 12 whose positive electrode is connected to the power supply terminal 6. The source of MOS-type FET 11 is connected to the terminal 6. The transistor 3 has the collector connected to the connection point between the bases of an NPN-type transistor 13 and a PNP-type transistor 14 which form a buffer amplifier and which have the emitters connected together to the gate of an N-channel MOS-type FET 15 which serves as a switching element. The transistor 13 has the collector connected to the positive electrode of a battery 16 which is connected at its negative electrode to the collector of transistor 14 whose collector is connected to the negative power supply terminal 8. The MOS-type FET 15 has the source connected to the terminal 8 and the drain connected to the drain of MOS-type FET 11. The connection point (output terminal) between the drains of MOS-type FETs 11 and 15 is grounded through a series circuit of a low pass filter 17, which is formed of a coil 17a serving as an inductive load and a capacitor 17b, and a resistor 18 such as a speaker or the like. In this case, the ground is taken as the mid voltage between the positive and negative DC voltages +Vcc and −Vcc.

With the above prior art amplifier circuit of FIG. 1, the MOS-type FETs 11 and 15 are made ON and OFF alternately by the PWM signal from the signal source 1, and the output signal developed at the connection point of the drains of MOS-type FETs 11 and 15 is fed through the low pass filter 17 to the speaker 18 which produces the audio.

In general, a MOS-type FET is not of minority carrier type, so that the former is rapid in switching operation. Thus, the MOS-type FET is generally considered suitable for being switched at high frequency, for example, about 500 KHz of a PWM signal.

Figure 2:
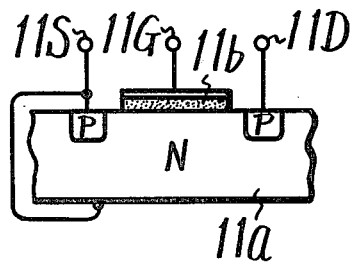
FIG. 2 is a cross sectional view of a P-channel FET used in the amplifier shown in FIG. 1.
Figure 3:
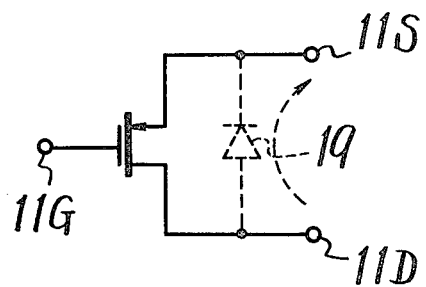
FIG. 3 is an equivant circuit of the P-channel FET shown in FIG. 2.

In general, however, as shown in FIG. 2, the P-channel MOS-type FET 11 has a semiconductor substrate 11a electrically connected to its source 11S so as to stabilize the potential of substrate 11a. Therefore, when a reverse current (it will be described later that when there is an inductive load the reverse current will flow) flows through the MOS-type FET 11, namely in this example the current flows from the drain 11D to the source 11S, a parasitic diode 19 is formed between the source 11S and drain 11D of the MOS-type FET 11, as shown in FIG. 3 by the dotted line. Due to the existence of the parasitic diode 19, the recovery time of the FET increases to, for example, 0.5 μsec. to 1 μsec. In FIG. 2, reference 11b designates an insulating layer and 11G designates the gate, respectively.

Figure 4A:
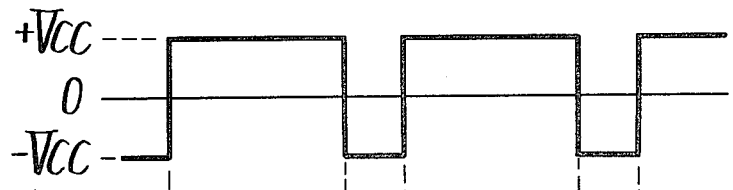
FIGS. 4A to 4D are waveform diagrams used for explaining an operation of the circuit shown in FIG. 1.
Figure 4B:
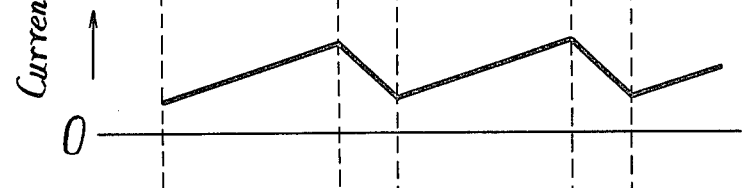
Figure 4C:
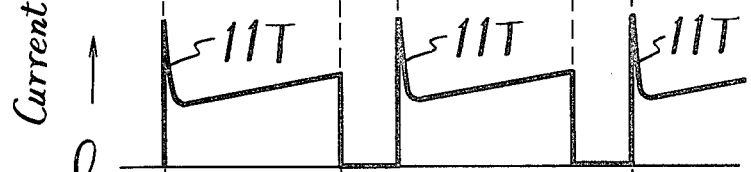
Figure 4D:
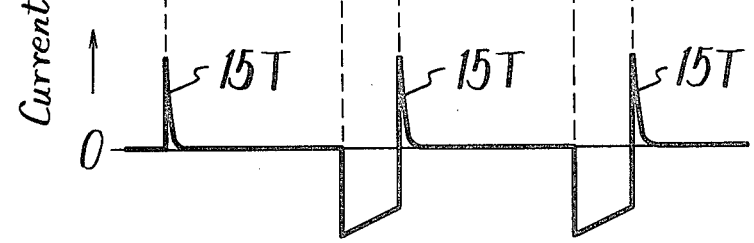

Therefore, when the PWM signal shown in FIG. 4A is produced from the signal source 1 in the prior art amplifier shown in FIG. 1, the current shown in FIG. 4B flows through the coil 17a. However, due to the great recovery time of MOS-type FETs 11 and 15, the currents containing very great eddy currents 11T and 15T shown in FIGS. 4C and 4D, respectively, flows through MOS-type FETs 11 and 15. Thus, in the amplifier shown in FIG. 1 power loss is caused by the eddy currents 11T and 15T and hence there occurs the possibility that the MOS-type FETs 11 and 15 are damaged by the heat generated by the eddy currents.

An example of the MOS-type FET amplifier according to the present invention, which avoids the defect occurred in the prior art, will be now described with reference to FIG. 5 in which the elements corresponding to those of FIG. 1 are marked with the same reference numerals and their detailed description will be omitted.

Figure 5:
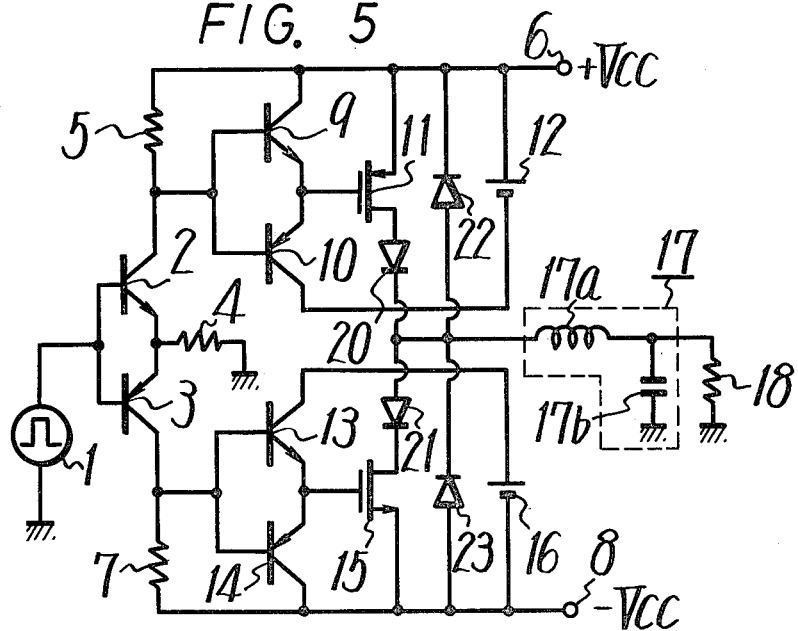
FIG. 5 is a circuit diagram showing an example of the MOS-type FET amplifier in accordance with the present invention.

In the example of the invention shown in FIG. 5, the drain of MOS-type FET 11 is connected to the anode of a diode 20 which has the cathode connected to the anode of a diode 21 which has, in turn, the cathode connected to the drain of MOS-type FET 15. The connection point between the diodes 20 and 21 is grounded through the series circuit of the low pass filter 17, which forms the inductive load, and resistor 18. In this case, the diodes 20 and 21 serve to prevent the reverse current from flowing to MOS-type FETs 11 and 15. Further, the connection point between the diodes 20 and 21 is connected to the anode of diode 22, which has the cathode connected to the positive power supply terminal 6, and also to the cathode of a diode 23 which has the anode connected to the negative power supply terminal 8. In this case, the reverse current intended to flow through the MOS-type FETs 11 and 15 flows through the diodes 22 and 23.

At present, a diode which is very rapid in switching time such as about 0.05 μsec., in now on market, so that such a diode can be used as each of the diodes 20 to 23 of this invention.

According to the amplifier of the present invention described above, since the reverse current for the MOS-type FETs 11 and 15 are flowing through the diodes 22 and 23 and only the forward current for the MOS-type FETs 11 and 15 flows therethrough, the recovery time of MOS-type FETs 11 and 15 is not affected any by the diode connection between the drain and source of each of the MOS-type FETs 11 and 15. Further, since the switching time of diode 22 and 23 is very rapid such as about 0.05 μsec., almost no eddy currents occur and hence the switching loss can be improved.

As described above, according to the MOS-type FET amplifier of the present invention including the MOS-type FETs through which both the currents in the forward and reverse directions could flow or which has the inductive load, the reverse current does not flow through the MOS-type FETs but flows through the diodes, so that the recovery time can be made short and hence the eddy current can be reduced to improve the switching loss.

In the example of the invention described and illustrated above, two MOS-type FETs are used and they are made ON and OFF alternately, but it will be easily understood that even if either one of two FETs is used only, the same effect can be achieved.

The above description is given mainly on one preferred embodiment of the invention, but it will be apparent that many modifications and variations could be effected by one skilled in the art without departing from the spirits or scope of the novel concepts of the present invention. Therefore, the spirits or scope of the invention should be determined by the appended claims only.

We claim as our invention:

1. A MOS-type FET amplifier comprising:
   (A) a DC voltage source having first and second terminals;
   (B) a first MOS-type FET having gate, source and drain electrodes;
   (C) a second MOS-type FET having gate, source and drain electrodes;
   (D) pulse signal source means for supplying a pair of drive signals to the gate electrodes of said first and second FETs with the same phase relation to each other;
   (E) first circuit means for connecting the source and drain electrodes of said first FET between the first terminal of said DC voltage source and an output terminal;

(F) second circuit means for connecting the source and drain electrodes of said second FET between the second terminal of said DC voltage source and said output terminal;
(G) third circuit means consisting of a first diode having anode and cathode electrodes and for connecting the anode and cathode thereof between said output terminal and the first terminal of said DC voltage source;
(H) fourth circuit means consisting of a second diode having anode and cathode electrodes and for connecting the anode and cathode thereof between the second terminal of said DC voltage source and said output terminal;
(I) low pass filter means connected to said output terminal so as to flow a forward current and a reverse current to a load in response to the drive signal from said pulse signal source means;
(J) fifth circuit means consisting of a third diode having anode and cathode electrodes and connecting the anode and cathode thereof between the first terminal of said DC voltage source and said output terminal in series with the source and drain circuit of said first FET so as to prevent the reverse current from flowing through said first FET; and
(K) sixth circuit means consisting of a fourth diode having anode and cathode electrodes and connecting the anode and cathode thereof between the second terminal of DC voltage source and said output terminal in series with the drain source circuit of said second FET so as to prevent the reverse current from flowing through said second FET.

2. A MOS-type FET amplifier according to claim 1, in which said first MOS-type FET is of a P-channel conductivity type and said second MOS-type FET is of an N-channel conductivity type.

3. A MOS-type FET amplifier according to claim 2, in which the anode and cathode of said third diode are connected between the drain of said P-channel FET and said output terminal, respectively.

4. A MOS-type FET amplifier according to claim 3, in which the cathode and anode of said fourth diode are connected between the drain of said N-channel FET and said output terminal, respectively.

5. A MOS-type FET amplifier according to claim 4, in which said low pass filter means comprises a series connection of an inductor and a capacitor, one free end of said inductor being connected to said output terminal, one free end of said capacitor being connected to a reference point and the connecting point therebetween being connected to said load.

6. A MOS-type FET amplifier according to claim 5, in which said pulse signal source means includes:
(A) a first complementary pair of drive transistors for driving the gate of said first FET; and
(B) a second complementary pair of drive transistors for driving the gate of said second FET.

* * * * *